United States Patent
Chen et al.

(10) Patent No.: US 8,181,139 B1
(45) Date of Patent: May 15, 2012

(54) MULTI-PRIORITY PLACEMENT FOR CONFIGURING PROGRAMMABLE LOGIC DEVICES

(75) Inventors: Xiaotao Chen, Macungie, PA (US); Eric Ting, Lower Macungie, PA (US); Ruofan Xu, Allentown, PA (US); Yanhua Yi, Allentown, PA (US); Jun Zhao, Allentown, PA (US)

(73) Assignee: Lattice Semicondutor Corporation, Hillsboro, OR (US)

( * ) Notice: Subject to any disclaimer, the term of this patent is extended or adjusted under 35 U.S.C. 154(b) by 315 days.

(21) Appl. No.: 12/341,929

(22) Filed: Dec. 22, 2008

(51) Int. Cl.
*G06F 17/50* (2006.01)

(52) U.S. Cl. .................. 716/121; 716/116; 716/128

(58) Field of Classification Search .................. 716/116, 716/121, 128
See application file for complete search history.

(56) References Cited

U.S. PATENT DOCUMENTS

| | | | |
|---|---|---|---|
| 5,648,913 A | 7/1997 | Bennett et al. | |
| 5,659,484 A | 8/1997 | Bennett et al. | |
| 6,240,541 B1 * | 5/2001 | Yasuda et al. | 716/112 |
| 6,763,506 B1 * | 7/2004 | Betz et al. | 716/108 |
| 6,813,754 B2 | 11/2004 | Wu et al. | |
| 7,143,378 B1 | 11/2006 | Nag | |
| 7,536,661 B1 * | 5/2009 | Singh et al. | 716/135 |
| 2008/0059931 A1 * | 3/2008 | Peters et al. | 716/9 |
| 2009/0319977 A1 * | 12/2009 | Saxena et al. | 716/13 |

OTHER PUBLICATIONS

Ren et al., Sensitivity Guided Net Weighting for Placement Driven Synthesis, ACM, pp. 10-17, 2004.
Zhuo et al., New Timing and Routability Driven Placement Algorithms for FPGA Synthesis, ACM, pp. 570-575, 2007.
Cong et al., Large-Scale Circuit Placement: Gap and Promise, Proceedings of the International Conference on Computer Aided Design (ICCAD'03), ACM, pp. 883-890, 2003.
Kong, Tim, A Novel Net Weighting Algorithm for Timing-Driven Placement, IEEE, pp. 172-176, 2002.
Impagliazzo, Russell, Hill-Climbing vs. Simulated Annealing for Planted Bisection Problems, Springer-Verlag Berlin Heidelberg, pp. 7-11, 2001.
Chang et al., FPGA Global Routing Based on a New Congestion Metric, 7 pages.
Barreiros et al., Global routing for lookup-table based FPGAs using genetric algorithms, pp. 1-7.
Lecture 11: Hill Climbing Simulated Annealed and Best First Search, http://www.cs.cf.ac.uk/htbin/Dave/AI/ai.pl?AI1/steep.html+prob_decomp+agenda+AI1/AI1.html+Lecture_10:_Problem_Decomposition+Lecture_12:_Agendas+AI_TOP_LEVEL+LECTURE_11:_Hill_Climbing_Simulated_Annealing_and_Best_First_Search, pp. 1-5, printed Nov. 3, 2008.

* cited by examiner

*Primary Examiner* — Nghia Doan
*Assistant Examiner* — Eric Lee
(74) *Attorney, Agent, or Firm* — Haynes and Boone, LLP

(57) ABSTRACT

In one embodiment of the invention, a computer-implemented method of configuring a programmable logic device (PLD) includes placing logical functions within logical resources of the PLD to implement a desired netlist; swapping the logical function of at least one logical resource with the logical function of at least one other logical resource within the PLD; and evaluating whether to accept or reject the swap using a simulated annealing process that calculates at least three cost function values based upon routing priority groups, timing priority groups, and a timing critical group.

10 Claims, 4 Drawing Sheets

MULTI-PRIORITY PLACEMENT FOR CONFIGURING PROGRAMMABLE LOGIC DEVICES

TECHNICAL FIELD

The present invention relates generally to programmable logic devices (PLDs) and, more particularly, to the configuration of programmable logic devices for maximum performance.

BACKGROUND

Prototyping a complex digital integrated circuit is complex and cost-intensive. As a design evolves and is debugged, circuit details may change. Should the design be embodied in an application specific integrated circuit (ASIC), the changes in design require mask changes and also affect related processing steps, thus requiring costly process changes. By prototyping the circuit using a PLD such as a field programmable gate array (FPGA), a user may debug and evolve the design without worrying about related process step changes that would be required if an ASIC were used to implement the design.

The configurability of a PLD into a given logical design comes at the cost of larger semiconductor die area (to provide the programmable features) as compared to an ASIC implementation. Thus, PLDs are often used during the prototyping stage but later replaced by ASICs as the design matures and production volumes increase. However, PLDs are increasingly replacing ASICs even in mature, prototyped applications because their re-programmability allows a user to upgrade or change a configuration over time with respect to software upgrades and the like.

The advantages of PLDs such as FPGAs over ASICs have increased as the logical resources have grown ever larger. It is now conventional for a modern FPGA to have the capacity of millions of logic gates. As the size of programmable logic devices increases due to technological advances, place-and-route tools necessary to configure the logical resources of a PLD are facing an ever more severe problem of balancing routability and performance with respect to the maximum achievable frequency of operation (Fmax) for the PLD. A slow design will not be competitive in today's FPGA market.

To configure an FPGA into a desired logic state, a user first maps the logical design into a netlist. A place-and-route software tool then maps the various logic functions within the netlist to logic blocks in the programmable logic device. Each of the numerous logic blocks within an FPGA may be configured by the place-and-route tool to perform a desired logical function. For example, one logic block may be configured to perform a logical AND function, another logic block may be configured to perform a logical NAND function, and so on. The input signals to a given logic block and its output signals are routed on a routing structure that connects the various logic blocks. Thus, a configuration must not only program the logic blocks into the appropriate logical configuration but must also configure the routing structure accordingly so that the various inputs and outputs to the logic blocks are routed appropriately. To configure the routing structure appropriately, switches within the routing structure are configured to connect the various logic blocks so that the input and output signals are driven as necessary.

The potential configuration of an FPGA by a place-and-route tool may be better understood with reference to FIG. 1, which illustrates a conventional FPGA 100. For illustration clarity, FPGA 100 includes just four logic blocks 105. The routing structure coupling input and output signals for these logic blocks is organized into row routing resources 110 and column routing resources 115. Each row and column routing resource includes a plurality of conductors for propagating the input and output signals. At each row and column resource intersection, a switch box 120 includes a plurality of switches for connecting selected row and column conductors. Input and output signals to the FPGA 100 are routed though input/output (I/O) circuits 130 that also connect to row and column routing resources through appropriate switch boxes.

A "place" portion of the place-and-route process for FPGA 100 involves the assignment of selected logical blocks to perform necessary logical functions within the net list. It is conventional for the detailed routing stage to be performed using "simulated annealing" techniques as known in the programmable logic arts. The "route" portion involves the configuration of the switch boxes so that the associated input and output signals for the various logic blocks are routed as demanded by the net list. The routing process is often implemented in stages through an initial global routing stage followed by a detailed routing stage. Global routing assumes that the switch boxes 120 are "fully populated" such that any given row conductor within a row routing resource 110 coupling to a switch box 120 may be connected to any given column conductor within a column routing resource 120 coupling to the same switch box (and vice versa). Because fully-populated switch boxes demand a great deal of semiconductor die space, it is conventional to construct the switch boxes as partially populated such that certain row conductors cannot be coupled through a corresponding switch box to certain column conductors. Such switch box routing restrictions are ignored during global routing. Because the various configured logic blocks must, connect to each other as demanded by the netlist being implemented, the detailed routing stage following the global routing stage determines actual switchbox switch setting to accommodate the required connections.

Because there is a large plurality of logic blocks and a robust routing structure connecting the logic blocks in a modern FPGA, such FPGAs may be configured in many different ways. It may be readily appreciated that if a given logic block requires an output from another logic block, an efficient configuration of the PLD would have these logic blocks immediately adjacent in the FPGA. If they are relatively far apart, the configuration will introduce unnecessary delay. However, the routing resources are typically arranged in rows and columns. Each row and column may accommodate only so many signals. Such constraints will fight the optimal placement of logic blocks in that, from an input/output viewpoint, it may be desirable to place logic blocks within the same row or column but it may not be possible for the routing structure to accommodate such placement.

Thus, it is conventional for a place-and-route tool to use tradeoffs to balance the competing goals for a programmable logic device configuration. In a first cut, the place-and-route tool will use global routing considerations to map the logical design to various logic blocks in the FPGA. Global routing does not assign a given signal to a given wire within a row or column of the routing structure. In other words, each row and column of the routing structure may be considered to form a bus having a width representing the total number of signals that may be accommodated on a given row or column routing resource. During a simulated annealing step after global routing, each of the various input signals and output signals to the logic blocks must be assigned to a particular row or column within the routing resources.

Because a partially-routed design is useless for implementing the required netlists, routability must typically take priority over design speed during the place-and-route process. But such a balanced approach will not achieve the highest possible Fmax. Therefore, there is a need in the art for improved programming tools to increase the maximum frequency of operation (Fmax) for PLDs.

SUMMARY

In accordance with one embodiment of the present invention, a computer-implemented method of configuring a programmable logic device (PLD) is provided. The method includes placing logical functions within logical resources of the PLD to implement a desired netlist; based upon the placement, estimating routing congestion for routing resources within the PLD resulting from a set of connections for the netlist; swapping the logical function of at least one logical resource with the logical function of at least one other logical resource within the PLD; and evaluating whether to accept or reject the swap using a simulated annealing process that evaluates at least two cost values a first cost value based upon a set of comparisons between estimated timing delays for the set of connections and corresponding target delays, the set of comparisons thereby ranging from a best comparison to a worst comparison, and a second cost value based upon a portion of the connections having the worst comparisons, wherein the second cost value is given higher priority than the first cost value.

In accordance with another embodiment of the present invention, a system is provided that includes one or more processors; and one or more memories adapted to store a plurality of computer readable instructions which when executed by the one or more processors are adapted to cause the system to perform a method of configuring a programmable logic device (PLD), the method comprising: placing logical functions within logical resources of the PLD to implement a desired netlist; based upon the placement, estimating routing congestion for routing resources within the PLD resulting from a set of connections for the netlist; swapping the logical function of at least one logical resource with the logical function of at least one other logical resource within the PLD; and evaluating whether to accept or reject the swap using a simulated annealing process that evaluates at least two cost values a first cost value based upon a set of comparisons between estimated timing delays for the set of connections and corresponding target delays, the set of comparisons thereby ranging from a best comparison to a worst comparison, and a second cost value based upon a portion of the connections having the worst comparisons, wherein the second cost value is given higher priority than the first cost value.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

To enhance the maximum achievable frequency of operation (Fmax) for a programmable logic device such as an FPGA, three new priority categories are introduced: routing priority, timing priority, and timing criticality. By a proper grouping and scoring of these categories, routing connections of highest priority can receive a higher probability of being optimized whereas routing connections of lower priority have less probability of being optimized. For a resource-rich device, the optimization of the highest routing priority group results in extreme performance.

These three categories define cost functions during the simulated annealing stage of the place-and-route process used to implement a given netlist. Simulated annealing is a well-known technique used to address the complexity of solving the map-and-route process, which belongs to the class of problems designated as "NP-complete." In general, the NP-complete nature of the place-and-route process for even a moderately resource-rich FPGA means that the computation time in even the fastest computers to find the absolute optimal solution is untenable (on the order of many years). The simulated-annealing approach to the place-and-route process provides a way to seek a reasonably optimal solution within a manageable period of computation.

Simulated annealing is aptly named because the process simulates the annealing of metals in which a metal is heated and then allowed to slowly cool so as to relieve internal stresses and improve ductility. At first, the various metal atoms will freely move but as the temperature cools atom movement becomes less and less likely. Similarly, during the simulated annealing process, a simulated "temperature" is also slowly cooled from a high level. For a given mapping of a netlist into an FPGA, a placement is assigned. The assignment of a given logic block to perform a given logical function within the netlist is moved to another logic block based upon a cost function during the simulated annealing process (for example, if the netlist requires a certain AND function, that AND function may be placed within a first logic block but then swapped with a second logic block during the simulated annealing process). The goal is to minimize the cost function as much as possible. However, because the cost function will define local minima that may be quite sub-optimal, simulated annealing will allow moves that increase the cost function when the simulated temperature is high. However, as the simulated temperature drops, the likelihood of such moves becomes less and less probable. In this fashion, the simulated annealing process encourages swaps that avoid the local minima and drive the cost function towards an optimal low (which results in higher operating frequencies because the placing and routing has been optimized).

Figure 2:
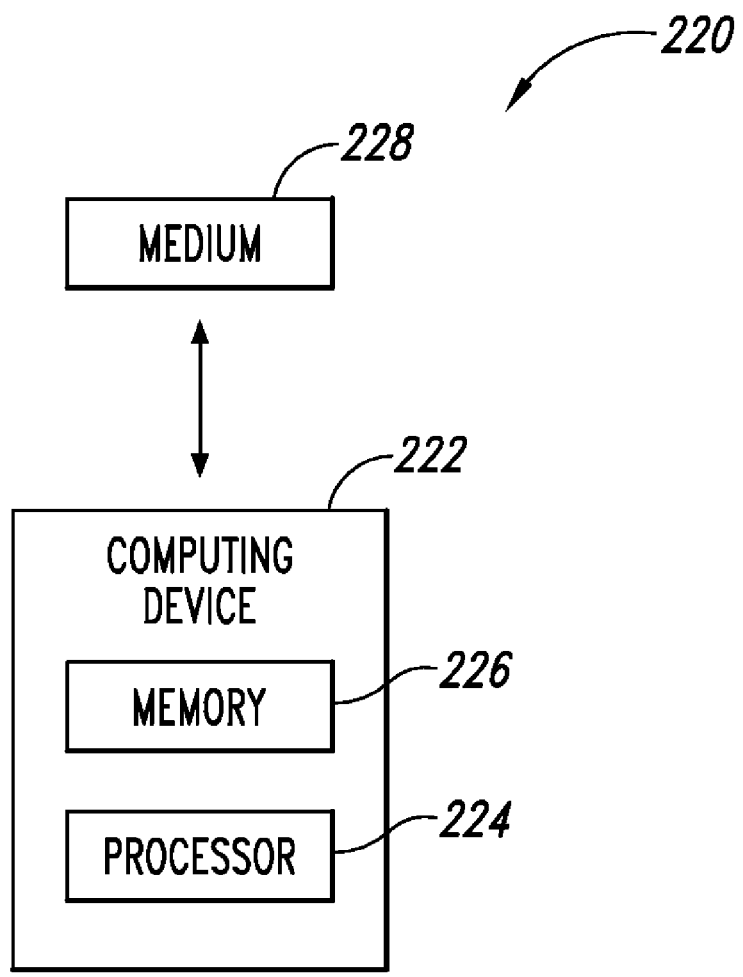
FIG. 2 is a block diagram of an example PLD configuration system that includes a place-and-route software tool.

As discussed above, three new priority categories are used to define three separate cost functions. These cost functions are tested in parallel to test the feasibility of a given swap within regard to an initial placement. As known in the place-and-route arts, a "swap" may comprise a trade of a grouping of logic blocks with another grouping of logic blocks or may be granular such that a swap comprises a trade between just two logic blocks. Regardless of the granularity of the swap, the cost functions are evaluated after each move. Turning now to FIG. 2, an example place-and-route tool is implemented using a system 220.

System 220 includes a computing device 222 and a computer readable medium 228. As shown, computing device 222 includes a processor 224 and a memory 226. Processor 224 may be configured with appropriate software (e.g., a computer program for execution by a computer) that is stored on computer readable medium 228 and/or in memory 226 to instruct processor 224 to perform one or more of the operations described herein.

Figure 1:
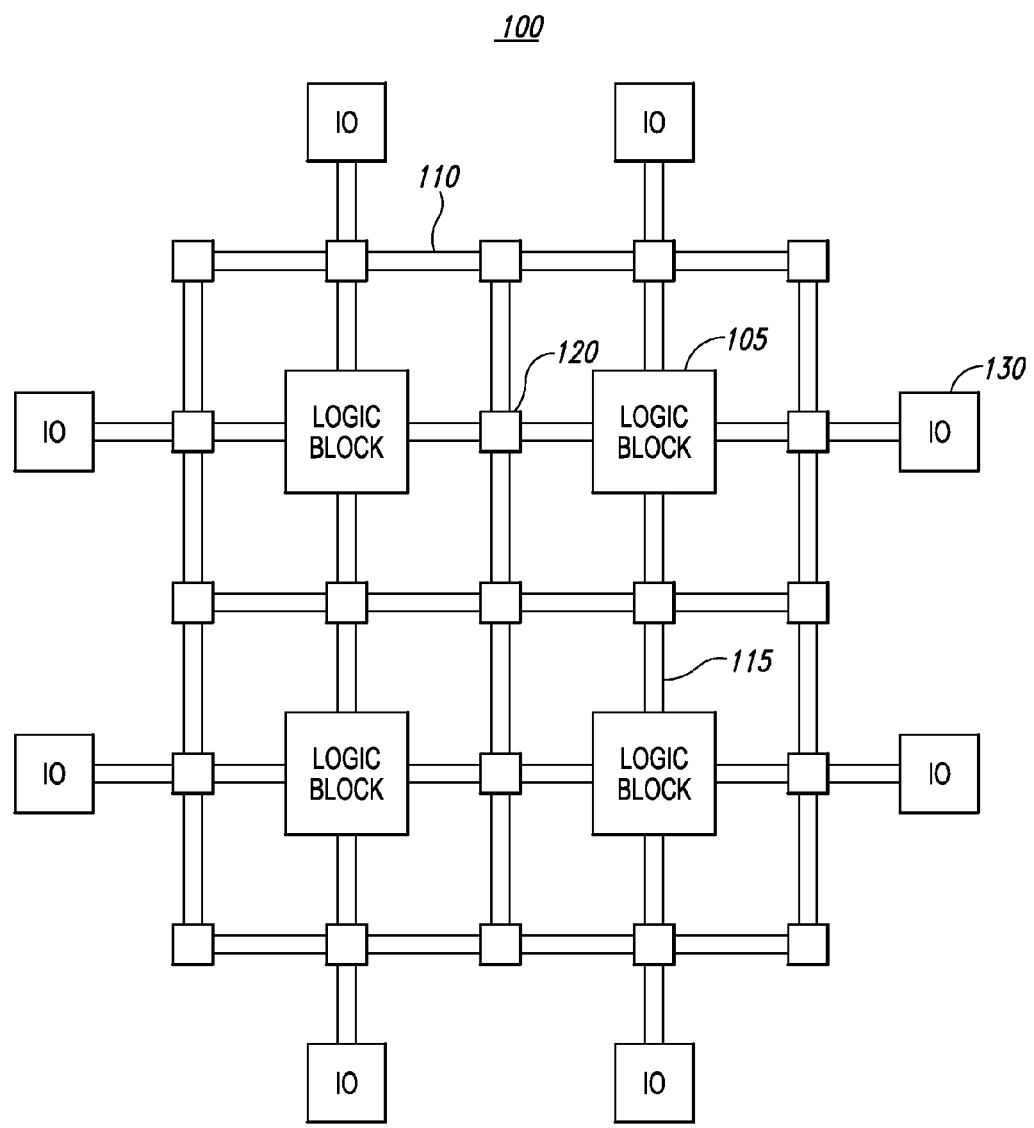
FIG. 1 is a simplified block diagram of a conventional FPGA.

In one embodiment, means such as processor 224 configured with such software may be used for mapping a plurality of circuit components of a circuit design to a plurality of components of a PLD, determining a cost value for each of the cost functions described further herein, swapping the logical resources, updating the cost values responsive to the swap, and selectively accepting or rejecting the swap based at least in part on the updated cost values. Processor 224 and memory 226 may be implemented in accordance with any appropriate components that may be used to provide computing system 220. Similarly, computer readable medium 228 may be implemented using any appropriate type of machine-readable medium used to store software. System 220 may be implemented to provide configuration data prepared by system 220 to a PLD such as FPGA 100 of FIG. 1.

Figure 3:
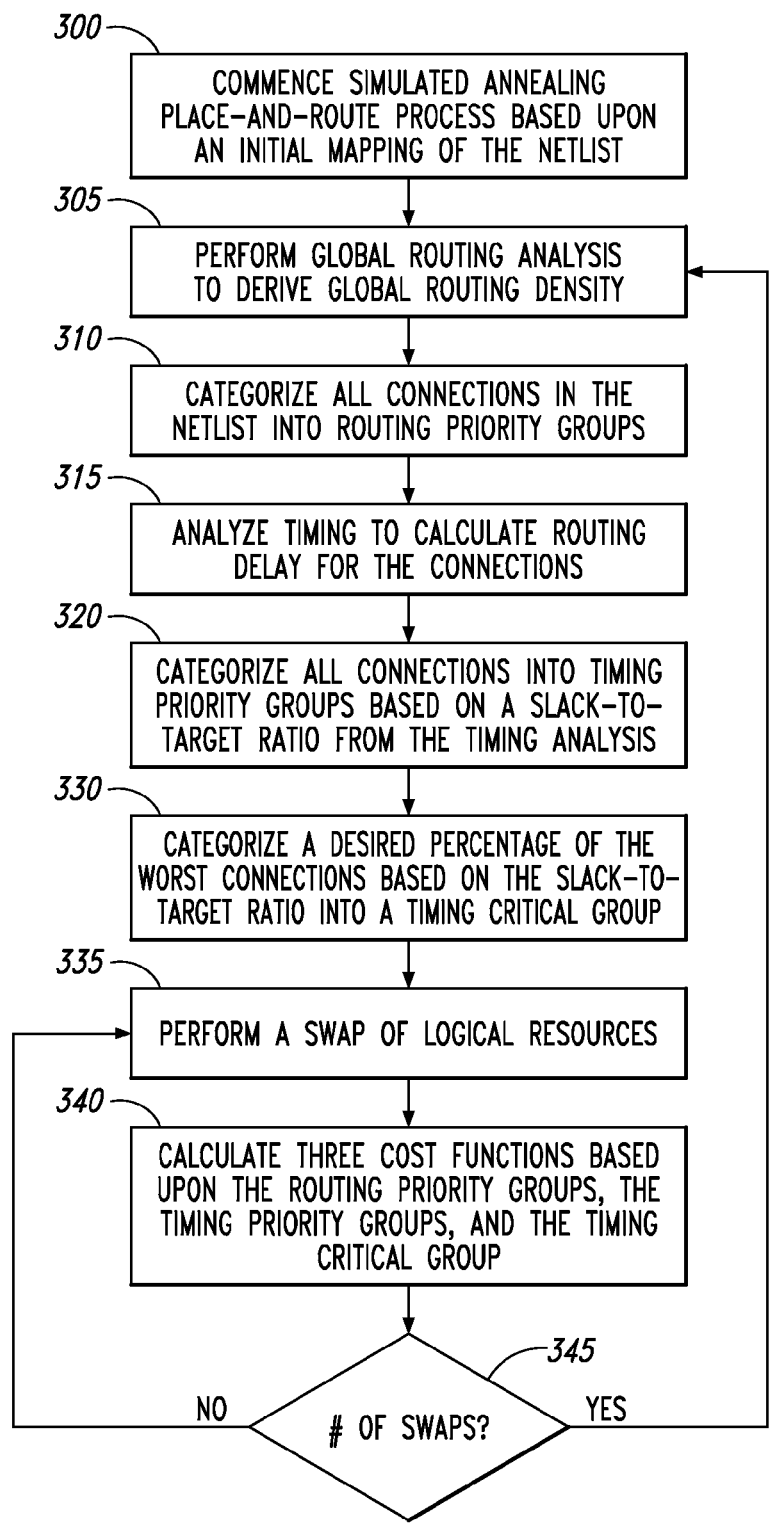
FIG. 3 is a flowchart illustrating an example place-and-route simulated annealing process that optimizes PLD operation speed.
Figure 4:
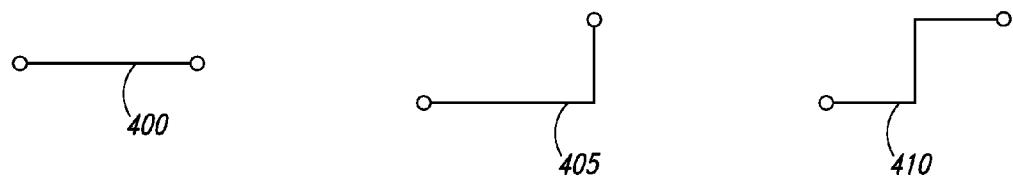
FIG. 4 illustrates a zero-bend routing, a one-bend routing, and a two-bend routing.

The evaluation of the three cost functions corresponding to the three priority categories by a place-and-route tool such as system 220 may be better understood with reference to the flowchart of FIG. 3. In a first step 300, the simulated annealing place-and-route process begins based upon an initial mapping of the netlist into the logical resources of a PLD (for example, a mapping into logic blocks 105 of FPGA 100 in FIG. 1). Based upon this mapping, system 220 performs a global routing analysis in a step 305 to derive for all connections in the netlist a distribution of the global routing density. It will be appreciated that a global routing analysis may be performed more simply if each connection in the netlist is routed with either zero-bend or one-bend routes in the routing resources of the PLD. In that regard, the following discussion will assume without loss of generality that the PLD being configured is an FPGA such as FPGA 100 of FIG. 1. As known in the global-routing arts, a zero-bend route would place a connection in the netlist entirely within one row routing resource 110 or within one column routing resource 115. A one-bend route would flow through two row and column routing resources as coupled though a corresponding switch box 120. However, it will be appreciated that a global routing analysis may also be performed without limitation to zero-bend or one-bend routes such as also including two-bend routes FIG. 4 illustrates an example O-bend route 400, a one-bend route 405, and a two-bend route 410.

Regardless of the type of global routing (such one-bend or two-bend) analysis employed in step 305, the global router will record the usage of each row and column routing resource as determined by whether a netlist connection uses these resources. Each netlist connection may then be assigned a "routing score" as determined by the corresponding routing resource usage. The higher the usage of a routing resource, the more likely it will be that the routing resource will be congested and hinder speedy operation. To characterize this congestion, system 220 performs a step 310 to categorize the netlist connections into "routing priority" groups based on each connection's routing score. For example, the connections with a routing score ranking in the top ten percent of all the routing scores for all connections maybe be categorized into a first routing priority group. The connections with a routing score ranking between the top ten percent and the top twenty percent of all the routing scores for all connections may be categorized into a second routing priority group, and so on.

System 220 also includes a timing analyzer software tool to estimate the routing delay across each netlist connection in a step 315. This estimated routing delay may be compared to a desired or target routing delay for each connection to determine a slack-to-target ratio given by:

Slack-to-target ratio=(estimated delay−target delay)/ target delay

System 220 uses the slack-to-target ratios for the netlist connections in a step 320 to categorize the connections into timing priority groups. These categorizations may be parallel to those used to establish the routing priority groups (e.g., if the worst routing priority group represents the top ten percent of the routing scores for all connections, the worst timing priority group could also represent the top ten percent highest slack-to-target ratios across all the connections). Alternatively, different groupings for the timing priority groups may be implemented in step 320.

System 220 also categorizes those connections corresponding to a desired percentage of the worst (highest) slack-to-target ratio scores into a timing critical group in a step 330. This categorization could correspond to the worse timing priority group or may be based on a different percentage.

Having determined the three priority groups (routing priority, timing priority, and timing critical), system 220 may perform a swap of logical resources in a step 335 as would be performed in any conventional simulated annealing process. Responsive to this swap, system 220 may then determine the cost function score for the three groupings in a step 340. In this fashion, three separate scores are determined for the swap according to the any changes in the three priority groups. These scores are prioritized such that any improvements in the critical timing group are weighted heavier than any improvements across the timing priority groups and such that any improvements across the timing priority groups are weighted heavier than any improvements across the routing priority groups.

These three cost function values may then be used as known in the simulated annealing arts to determine whether to accept the swap performed in step 335 or to reject this swap. Referring back to steps 305 to 330, it will be appreciated that these steps are computation intensive such that it is more efficient to not re-calculate these steps after every swap. Instead, the timing analysis and the various groupings may be re-used for a pre-determined number of swaps. For example, if the pre-determined number is four, then four swaps could be performed and evaluated before re-calculating steps 305 to 330. Thus, system 220 may perform a step 345 of determining the number of swaps since the last repetition of steps 305 to 330. If this number of swaps does not exceed the pre-determined number, then steps 335 and 340 may be repeated. Alternatively, if the number of swaps has exceeded the pre-determined number, then acts 305 to 330 may be re-calculated before performing a subsequent swap in step 335. For illustration clarity, FIG. 3 does not include a step for the well-known termination of the simulated annealing process (when the simulated temperature is cooled to the final temperature, the simulated annealing process ends).

Embodiments described above illustrate but do not limit the invention. It should also be understood that numerous modifications and variations are possible in accordance with the principles of the present invention. Accordingly, the scope of the invention is defined only by the following claims.

We claim:

1. A computer-implemented method of configuring a programmable logic device (PLD), the method comprising:
   based on an initial mapping into the PLD of a netlist, performing a global routing analysis of all netlist connections;
   based on the analysis, assigning to each netlist connection a routing score determined by the connection's routing resource usage;
   categorizing the netlist connections into at least two routing priority groups based on each connection's routing score;
   calculating a slack-to-target ratio for each netlist connection, wherein the ratio=(estimated delay−target delay)/target delay;
   categorizing the netlist connections into at least two timing priority groups based on each connection's slack-to-target ratio;
   categorizing a certain percentage of the highest slack-to-target ratios into a timing critical group;
   swapping the logical function of at least one logical resource with the logical function of at least one other logical resource within the PLD; and
   calculating, by a computer, three cost function values in parallel based on the routing priority groups, the timing priority groups, and the timing critical group, respectively; and
   evaluating whether to accept or reject the swap using a simulated annealing process and at least the three cost function values.

2. The method of claim 1, wherein the cost function value based on the timing critical group has a higher priority than the first cost function value based on the timing priority groups, and the cost function value based on the timing priority groups has a higher priority than the cost function value based on the routing priority groups.

3. The method of claim 1 including, after evaluating the at least three cost function values, performing another swapping of at least one logical resource and evaluating whether to accept or reject the other swap before again performing the categorizing steps of the method.

4. The method of claim 3 including, after a pre-determined number of swaps, again performing the categorizing steps of the method.

5. The method of claim 1, wherein the PLD is a field programmable logic array (FPGA) and the logical resources include a plurality of logic blocks.

6. The method of claim 1, wherein the routing resources comprise row routing resources and column routing resources.

7. A non-transitory computer readable medium on which are stored computer readable instructions for performing the following:
   based on an initial mapping into a programmable logic device (PLD) of a netlist, performing a global routing analysis of all netlist connections;
   based on the analysis, assigning to each netlist connection a routing score determined by the connection's routing resource usage;
   categorizing the netlist connections into at least two routing priority groups based on each connection's routing score;
   calculating a slack-to-target ratio for each netlist connection, wherein the ratio=(estimated delay−target delay)/target delay;
   categorizing the netlist connections into at least two timing priority groups based on each connection's slack-to-target ratio;
   categorizing a certain percentage of the highest slack-to-target ratios into a timing critical group;
   swapping the logical function of at least one logical resource with the logical function of at least one other logical resource within the PLD; and
   calculating three cost function values in parallel based on the routing priority groups, the timing priority groups, and the timing critical group, respectively; and
   evaluating whether to accept or reject the swap using a simulated annealing process and at least the three cost function values.

8. The computer readable medium of claim 7, wherein the cost function value based on the timing critical group has a higher priority than the first cost function value based on the timing priority groups, and the cost function value based on the timing priority groups has a higher priority than the cost function value based on the routing priority groups.

9. The computer readable medium of claim 7 including, after evaluating the at least three cost function values, performing another swapping of at least one logical resource and evaluating whether to accept or reject the other swap before again performing the categorizing steps of the method.

10. The computer readable medium of claim 9 including, after a pre-determined number of swaps, again performing the categorizing steps of the method.

* * * * *